United States Patent [19]

Lechaton et al.

[11] Patent Number: 4,960,726
[45] Date of Patent: Oct. 2, 1990

[54] BICMOS PROCESS

[75] Inventors: John S. Lechaton; Dominic J. Schepis, both of Wappingers Falls, N.Y.

[73] Assignee: International Business Machines Corporation, Armonk, N.Y.

[21] Appl. No.: 424,363

[22] Filed: Oct. 19, 1989

[51] Int. Cl.⁵ .......................................... H01L 21/70
[52] U.S. Cl. ............................................ 437/59; 437/31; 437/33; 437/41; 437/162; 437/228; 437/233
[58] Field of Search ................... 437/31, 32, 33, 233, 437/228, 41, 59, 162

[56] References Cited

U.S. PATENT DOCUMENTS

| | | | |
|---|---|---|---|
| 4,475,279 | 10/1984 | Gahle | 437/99 |
| 4,475,279 | 10/1984 | Gahle | 29/577 C |
| 4,484,388 | 11/1984 | Iwasaki | 29/571 |
| 4,486,942 | 12/1984 | Hirao | 437/99 |
| 4,497,106 | 2/1985 | Momma | 437/162 |
| 4,507,847 | 4/1985 | Sullivan | 29/576 B |
| 4,637,125 | 1/1987 | Iwasaki | 29/571 |
| 4,688,314 | 8/1987 | Weinberg | 437/162 |
| 4,707,456 | 11/1987 | Thomas | 437/162 |
| 4,735,916 | 4/1980 | Homma | 437/162 |
| 4,737,472 | 4/1988 | Schaber et al. | 437/59 |
| 4,752,589 | 6/1988 | Schaber | 437/31 |
| 4,764,482 | 8/1988 | Hsu | 437/57 |
| 4,778,774 | 10/1988 | Blossfeld | 437/31 |
| 4,816,423 | 3/1989 | Havemann | 437/31 |
| 4,818,720 | 4/1989 | Iwasaki | 437/58 |

Primary Examiner—Brian E. Hearn
Assistant Examiner—T. Thomas
Attorney, Agent, or Firm—Jeffrey L. Brandt

[57] ABSTRACT

A method for manufacturing a BiCMOS device includes providing a semiconductor substrate including first and second electrically isolated device regions. A layer of insulating material is formed over the first device region, and a layer of conductive material is formed conformally over the device. Portions of the conductive layer are removed to leave a base contact on the surface of the second device region and an insulated gate contact over the surface of the first device region. A FET is formed in the first device region having a channel under the insulated gate. A vertical bipolar transistor is formed in the second device region having a base region contacting the base contact.

10 Claims, 4 Drawing Sheets

4,960,726

BICMOS PROCESS

The present invention relates generally to the fabrication of semiconductor devices and more particularly to an integrated BiCMOS process for forming bipolar and complementary field-effect semiconductor devices.

BACKGROUND OF THE INVENTION

Many processes are known in the art for simultaneously forming bipolar and complementary metal-oxide semiconductor devices (hence the term BiCMOS) on a single substrate. The resulting chips can be utilized in a manner which exploits the different advantages of the bipolar and field-effect transistors. The field-effect transistors can be used, for example, in a manner which takes advantage of their recognized low power requirements, while the bipolar devices can be used for applications requiring high switching speeds and/or relatively higher driving power.

One disadvantage inherent in many of the known BiCMOS processes is the inability to yield high-performance devices of both the bipolar and field-effect type. Processes which have been optimized for manufacturing bipolar devices, for example, typically yield low performance field-effect devices. The converse is true for processes optimized to make field-effect devices. Processes which attempt to optimize both device types are typically complex and difficult to implement.

In attempting to provide simplified BiCMOS processes which yield high-performance devices, it has become known in the art to define MOS gates and bipolar emitter and/or collector contacts from a single layer of poly-conductive material. U.S. Pat. No. 4,752,589 to Schaber, for example, utilizes a single layer of polysilicon to define both the MOS gates and the bipolar emitter contact. U.S. Pat. No. 4,818,720 to Iwasaki shows a method wherein the MOS gate electrodes and the bipolar emitter and collector contacts are defined from a single layer of polysilicon.

It is desirable in the art to provide a BiCMOS process which is compatible with conventional semiconductor processing techniques, which is not unduly complex or expensive, and which yields high-performance devices of both the bipolar and field-effect type.

SUMMARY OF THE INVENTION

An object of the present invention is to provide a new and improved method for fabricating bipolar and field-effect transistors on a semiconductor substrate.

Another object of the present invention is to provide such a BiCMOS process which yields high-performance bipolar and field-effect transistors.

A further object of the present invention is to provide a BiCMOS process of the above-described type which is compatible with conventional semiconductor manufacturing techniques.

In accordance with the present invention, there is provided a method comprising the steps of: providing a substrate of semiconductor material including at least first and second electrically isolated device regions; forming a first layer of insulating material conformally over the substrate; patterning the first layer to expose a surface portion of the second device region; forming a second layer of conductive material generally conformally over the first and second device regions, the second layer spaced from the surface of the first device region by the first layer and the second layer contacting the surface of the second device region; forming an aperture in the second layer over the second device region; removing portions of the second layer to leave a base contact on the surface of the second device region and a separate gate contact insulated from the surface of the first device region by the first layer; the step of forming the aperture performed before the removing step; forming a field-effect transistor having a channel region underlying the gate contact in the first device region; and forming a vertical bipolar transistor having a base region contacting the base contact in the second device region.

BRIEF DESCRIPTION OF THE DRAWINGS

These and other objects, features, and advantages of the present invention will become apparent from a consideration of the detailed description and drawing figures, in which.

DETAILED DESCRIPTION OF THE INVENTION

In the description of the invention, "N" and "P" are used, where appropriate with "+" and "−" modifiers, to define relative dopant types and concentrations. In describing insulated-gate transistors, "field-effect transistor" (FET) is used interchangeable with "metal-oxide semiconductor" (MOS).

Figure 1:
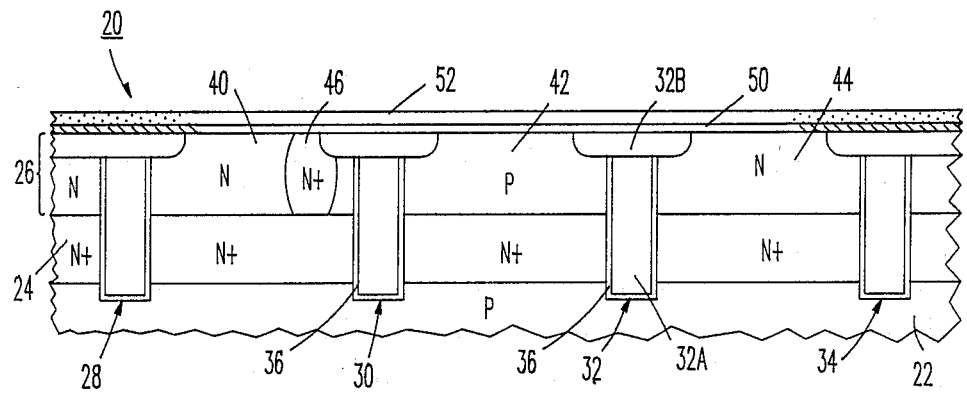
FIGS. 1–10 are cross-sectional views illustrating consecutive steps in forming BiCMOS devices in accordance with one embodiment of the present invention.

Referring now to the drawings, FIG. 1 shows a portion 20 of a semiconductor chip including a monocrystalline, P-type, silicon substrate 22. An N+subcollector layer 24 of monocrystalline silicon overlays substrate 22, and a layer 26 of epitaxial silicon overlays subcollector layer 24.

Four generally identical, spaced isolation trenches 28, 30, 32, 34 extend from the surface of epitaxial layer 26 downward through subcollector layer 24 and terminate in substrate layer 22. Describing an exemplary trench 32 in detail, each of the trenches includes a deep trench portion 32A extending vertically through the stacked layers as described above, and a shallow, horizontally extending trench portion 32B disposed over the deep trench portion proximate to the surface of epitaxial layer 26. Each deep trench portion 32A is lined with an insulating wall 36 such as silicon dioxide, and filled with a filler material 38 such as polysilicon or an insulator. Each shallow trench portion 32B comprises an insulating material such as silicon dioxide or intrinsic polysilicon. It will be understood that the dimensions of the shallow trench portions can be varied to accommodate various device features.

Trenches 28, 30, 32, 34 together define three electrically isolated device regions 40, 42, 44 disposed therebetween. Each device region 40, 42, 44 is generally bounded by isolation trenches on the sides, subcollector layer 24 on the bottom, and the upper surface of epitaxial layer 26. Device region 40 represents an N well in which a vertical, NPN bipolar transistor will be formed, and includes an N+reach-through region 46 extending from the upper surface thereof into contact with subcollector region 24. Device regions 42, 44 represent P and N wells in which NFET and PFET transistors will be formed, respectively.

Many conventional semiconductor fabrication methods are known for providing the structure 20 as described above. For purposes of illustration, one such method is set out in the steps below.

(1) Substrate 22 is provided as the result of a conventional crystal pull, having, for example, a <100>-crystal orientation.

(2) Subcollector layer 24 is doped by diffusion or ion implantation into the surface of substrate 22.

(3) Epitaxial layer 26 is deposited, using a conventional epitaxial chemical vapor deposition process, onto the doped surface of substrate 22. It will be understood that, during the epitaxial growth of layer 26, layer 24 can autodiffuse upward from substrate 22 into layer 26.

(4) Conventional trench formation techniques are used to form isolation trenches 28, 30, 32, 34. Methods of forming and filling trenches are shown, for example, in U.S. Pat. Nos. 4,307,180 and 4,473,598 (both assigned to the assignee of the present invention). It will be understood that the present invention is not limited to the use of trenches for isolation, and that other isolation techniques such as recessed oxide isolation (ROX) and semi-ROX can be used.

(5) Conventional photolithographic masking and diffusion or ion implantation processes are used to dope device regions 40, 42, 44 to the desired N, P, and N concentrations, respectively, and to form reachthrough region 46.

Continuing to describe FIG. 1, subsequent to the above-described steps, a gate oxide layer 50 of silicon dioxide is formed on the surface of the device. Gate oxide layer 50 is preferably formed by a process of thermal oxidation to a thickness in the range of about 15–25 nanometers (nm). A first, thin layer 52 of polysilicon is deposited over gate oxide layer 50, by chemical vapor deposition (CVD), to a thickness in the range of about 200–600 Angstroms. It will be noted that, optionally, a shallow isolation trench (not shown) can be formed at the surface of device region 40 adjoining reachthrough region 46 and between the reachthrough region and aperture 56 (FIG. 2).

Figure 2:
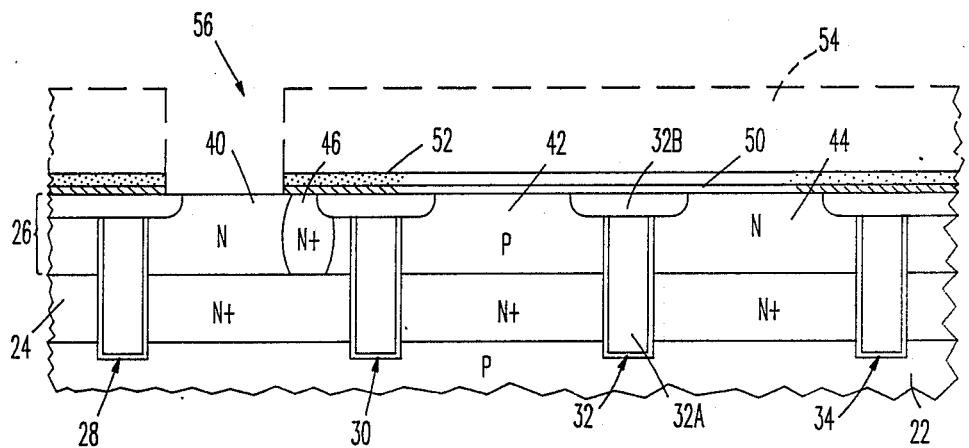

Referring now to FIG. 2, conventional photolithographic techniques are used to provide a sacrificial photoresist mask, shown in dashed line at 54, defining an aperture 56 spanning the adjacent shallow regions of isolation trenches 28, 30. A reactive ion etching (RIE) process using a plasma such as $SF_6Cl_2He$ is used to remove the exposed portion of polysilicon layer 52. To avoid damage to the surface of device region 40, a wet etch such as a BHF dip is used to remove the exposed portion of underlying silicon dioxide layer 50.

Figure 3:
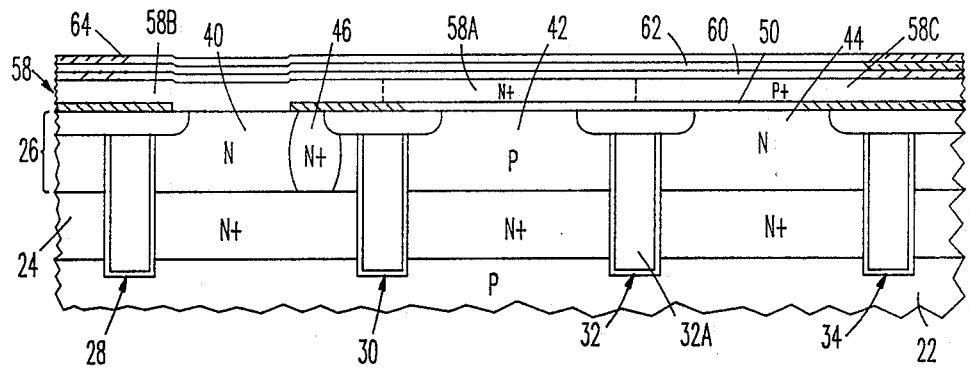

Referring now to FIG. 3, polysilicon is deposited conformally over the device, by a process of CVD to a thickness in the range of 200–400nm, increasing the thickness of the remaining portions of layer 52 to yield polysilicon layer 58. Photolithographic masking is used with ion implantation or diffusion to dope the portion 58A of layer 58 overlying device region 42 to an N+type, and the portions 58B, 58C, overlying device regions 40, 44, respectively, to a P+type An optional silicide layer 60 is formed, for example by a process of co-sputtering or evaporation, conformally over the surface of polysilicon layer 58 to a thickness in the range of 50–70nm. A layer 62 of silicon dioxide is formed conformally over layer 60 by a process of chemical vapor deposition and to a thickness in the range of 100–150nm. A layer 64 of silicon nitride is formed conformally over layer 62 by a process of CVD and to a thickness in the range of 100–150nm.

Figure 4:
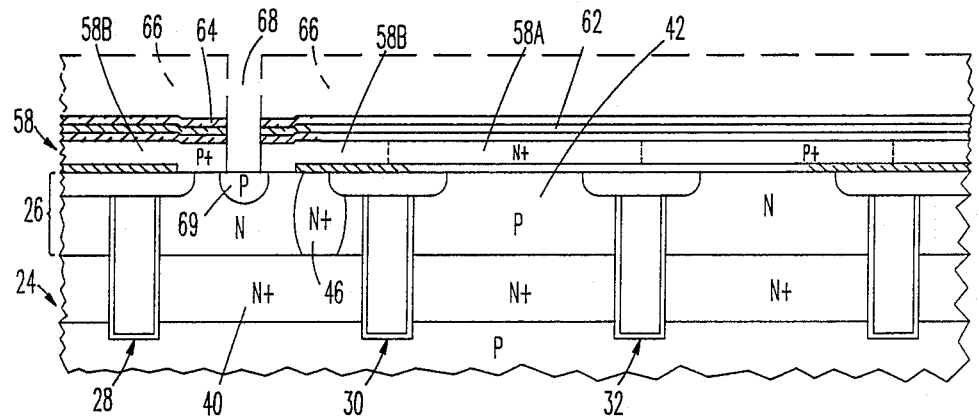

Referring now to FIG. 4, photolithographic techniques are used to produce a sacrificial photoresist mask, shown in dashed line at 66, defining an aperture 68 generally centered in device region 40 between reachthrough region 46 and isolation trench 28. An anisotropic etchant such as a RIE process using a $CF_4$ or $CHF_3/Ar$ plasma is used to remove the exposed portions of overlying layers 64, 62. An anisotropic etchant such as a RIE process using a chlorinated plasma (i.e., $CCl_2F_2$) is used to remove the exposed portions of layers 60, and 58A, extending aperture 68 to the surface of device region 40. With resist mask 66 still in place, a P type intrinsic base region 69 is formed in device region 40 through aperture 68, preferably using a process of ion implantation.

Figure 5:
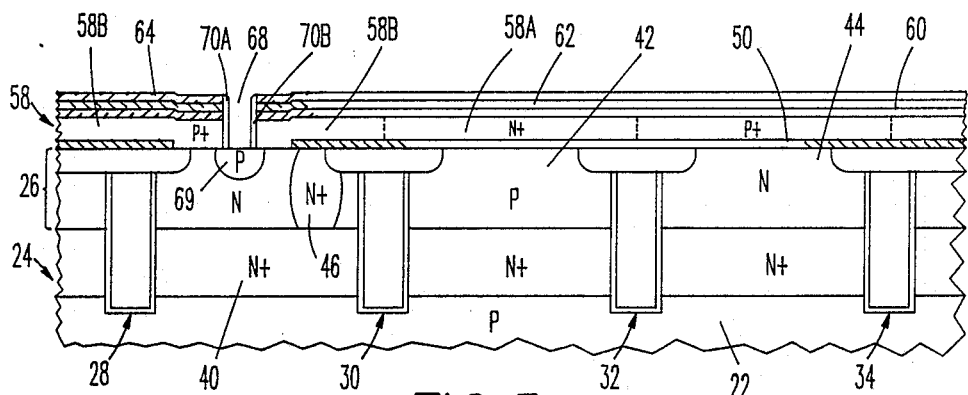

Referring now to FIG. 5, insulating sidewalls 70A, 70B of silicon dioxide are formed to cover the exposed walls of layers 58, 60, 62, 64 in aperture 68. Sidewalls 70A, 70B are formed by first depositing a blanket layer of silicon dioxide (not shown) conformally over the device. This blanket layer is then etched utilizing an anisotropic etch such as a RIE process using a $CHF_3/Ar$ plasma. This process of forming sidewalls is shown and described in U.S. Pat. No. 4,256,514 to Pogge, assigned to the assignee of the present invention. Prior to forming sidewalls 70A, 70B, it is desirable to use a thermal oxidation process to form a thin, protective layer (not shown) of silicon dioxide over base region 69. This protective layer is removed during the etching step used to form the sidewalls.

Figure 6:
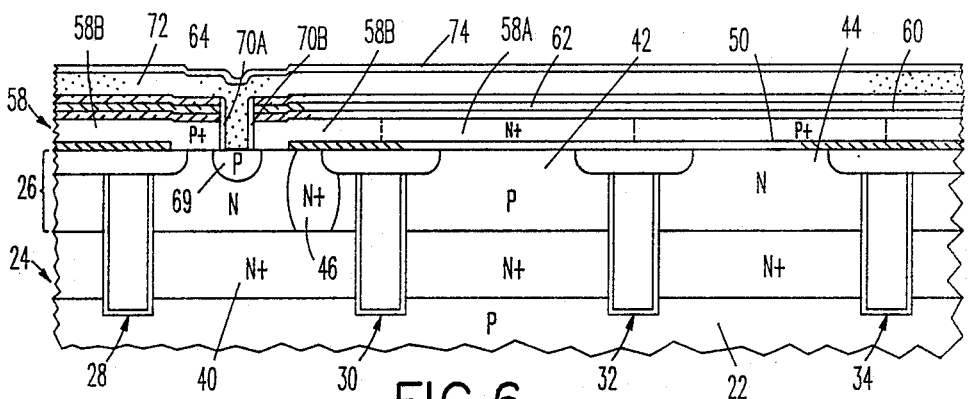

Referring now to FIG. 6, a layer 72 of polysilicon is deposited conformally over the device, for example using a CVD process and to a thickness in the range of 150–250nm. As shown in the drawing, layer 72 at least partially fills aperture 68 (FIG. 5), extending into contact with the surface of base region 69. Insulating sidewalls 70A, 70B electrically isolate layer 72 within aperture 68 from the walls of layers 58, 60, 62, and 64. Ion implantation is used to dope layer 72 to N+type. A thin, protective layer 74 of silicon dioxide is optionally formed over doped layer 72, for example by thermal oxidation.

Figure 7:
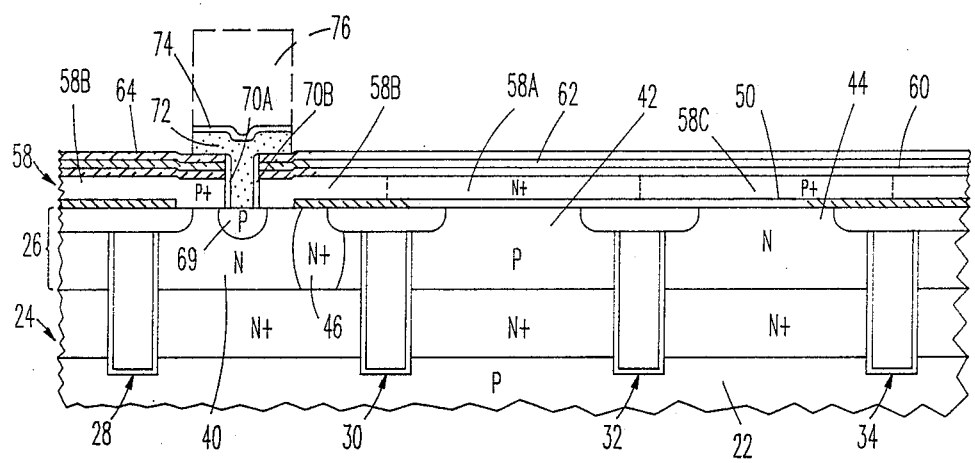

Referring now to FIG. 7, conventional photolithographic techniques are used to form a sacrificial photoresist mask, indicated in dashed-line at 76. Mask 76 covers the portion of layers 72, 74 which fill aperture 68 (FIG. 5). An anisotropic etchant, for example a RIE process using a chlorinated plasma, is used to etch away the unmasked portions of layers 74 and 72, stopping on layer 64.

Figure 8:
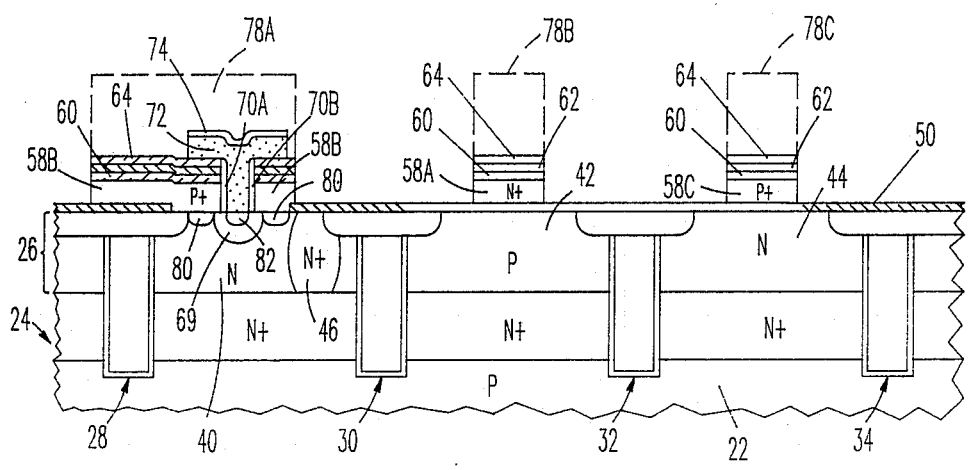

Examining now FIG. 8, conventional photolithographic techniques are again used, this time to form the sacrificial photoresist mask indicated in dashed line at 78A, 78B, 78C. Mask 78A covers a region of the chip extending from over trench 28 to a location on device region 40 spaced slightly laterally from the surface of reach-through region 46. Masks 78B, 78C cover areas generally centered over device regions 42, 44, respectively. With mask 78 in place, an anisotropic etch is used to remove the exposed portions of layers 64, 62, 60, and 58, stopping on layer 50. This etch can comprise, for example, a RIE process utilizing a $CF_4$ plasma to etch layers 64, 62, and a chlorinated plasma to etch layers 60, 58.

Figure 9:
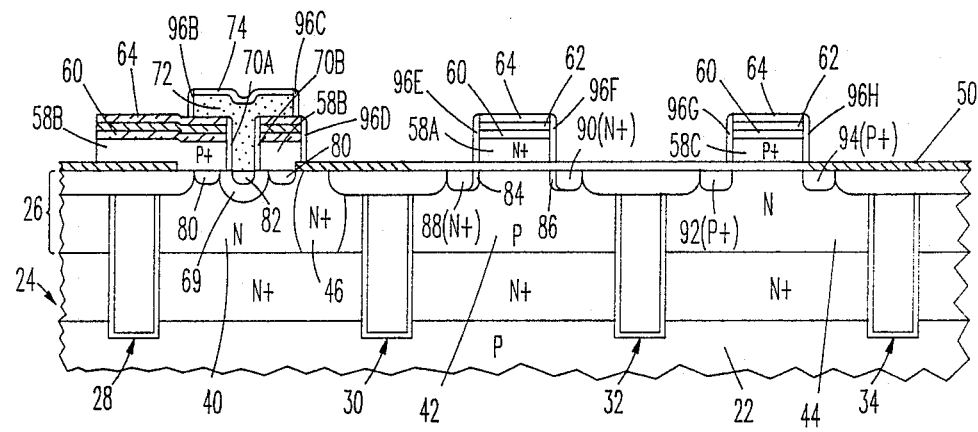

Referring now to FIG. 9, conventional techniques are used to form N type lightly doped drain regions 84, 86, and N+type source and drain region 88, 90, in device region 42. There is thus completed an N-channel FET having an insulated gate 58A. Similarly conventional techniques are used to form P+source and drain regions 92, 94 in device region 44, completing a P-channel FET having an insulated gate 58C. These FET regions can be formed, for example, by the following steps:

(1) a sacrificial photoresist mask is formed exposing only device region 42;
(2) lightly doped drain regions 84, 86 are formed by ion implantation;
(3) disposable sidewalls are formed on the sides of gate 58A;
(4) source and drain regions 88, 90 are formed by ion implantation, and the disposable sidewalls removed;
(5) a sacrificial photoresist mask is formed exposing only device region 44; and
(6) source and drain region 92, 94 are formed by ion implantation.

Other processes for completing the formation of the FETs in device regions 42, 44 will be known to those skilled in the art.

Insulating sidewalls of silicon dioxide, indicated at 96A–96H, are formed over all of the exposed vertical walls on the device. These sidewalls are formed, for example, using the blanket deposition and anisotropic etching steps described hereinabove.

The device is subjected to a thermal anneal, causing dopants from polysilicon regions 58B and 72 to diffuse outward into device region 40. A P type extrinsic base region 80 is thus formed in contact with intrinsic base region 69 and in self-aligned contact with polysilicon layer 58B. Similarly, an N type emitter region 82 is formed in the surface of intrinsic base region 69, in self-aligned contact with polysilicon layer 72. A vertical, NPN bipolar transistor is thus formed in device region 40 including emitter region 82, intrinsic and extrinsic base regions 69, 80, and collector region 24. This bipolar transistor further includes a base contact 58B and an emitter contact 72. A collector contact (not shown in FIG. 8) will later be formed to reach-through region 46. Simultaneously, this anneal functions to drive in the source drain regions of the FETs in device regions 42, 44.

Figure 10:
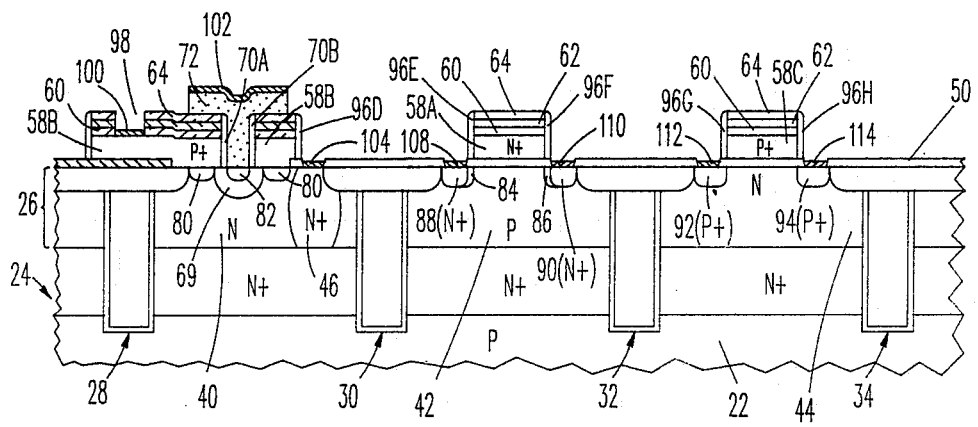

Referring now to FIG. 10, a sacrificial photoresist mask (not shown) is used with appropriate etchants to open an aperture 98 through layers 60, 62, to silicide layer 60 on the surface of base contact 58B. Masking and appropriate etchants are further used to remove oxide layer 74 from the surface of emitter contact 72, and to remove the portions of oxide layer 50 overlying reach-through region 46, source drain regions 88, 90 in device region 42, and source drain regions 92, 94 in device region 44.

After the photoresist mask is removed, the exposed device regions are silicided to provide the following device contacts: base contact 100, emitter contact 102, and collector contact 104 for the NPN bipolar transistor in device region 40; source contact 108 and drain contact 110 for the N-channel FET in device region 42; and, source contact 112 and drain contact 114 for the P-channel FET in device region 44. This selective silicide is formed, for example, by the conventional processes of metal evaporation and sintering. Contacts (not shown) are made to FET gates 58A and 58C by extending the gates to external contact pads, and by etching through the overlying layers 62/64 to the silicide layer 60 in the same manner as done to base contact 58B. Electrical connections are then made to these device contacts in a conventional manner.

There is thus provided a new and improved BiCMOS process for forming bipolar and FET devices on a semiconductor substrate. Using a single layer of polyconductive material to define both the bipolar device base contact and the FET device gates, the process is cost-efficient and compatible with known semiconductor processing techniques. The resulting bipolar and FET devices are high-performance, state-of-the-art devices.

The present invention has industrial application in the formation of semiconductor devices, particularly in the formation of VLSI chips requiring both bipolar and FET logic devices.

While the invention has been shown and described with respect to particular embodiments, it is not so limited. Numerous modifications, changes and improvements will occur which fall within the spirit and the scope of the present invention.

What is claimed is:

1. A method comprising the steps of:
providing a substrate of semiconductor material including at least first and second electrically isolated device regions;
forming a first layer of insulating material conformally over said substrate;
patterning said first layer to expose a surface portion of said second device region;
forming a second layer of conductive material generally conformally over said first and second device regions, said second layer spaced from the surface of said first device region by said first layer and said second layer contacting the surface of said second device region;
forming an aperture in said second layer over said second device region;
removing portions of said second layer to leave a base contact on the surface of said second device region and a separate gate contact insulated from the surface of said first device region by said first layer;
said step of forming said aperture performed before said removing step;
forming a field-effect transistor having a channel region underlying said gate contact in said first device region; and
forming a vertical bipolar transistor having a base region contacting said base contact in said second device region.

2. A method in accordance with claim 1 wherein said first layer includes silicon dioxide.

3. A method in accordance with claim 1 wherein said second layer includes polysilicon.

4. A method in accordance with claim 1 and further including the step of forming an intrinsic base region in said second device region through said aperture before said removing step.

5. A method in accordance with claim 4 and further including the step of using said gate contact as a mask to deposit source and drain regions in said first device region.

6. A method in accordance with claim 4 and further including the step of insulating the walls of said aperture before said removing step.

7. A method in accordance with claim 6 and further including the steps of:

forming an emitter region in said base region through said aperture; and forming an emitter contact to said emitter region in said aperture.

8. A method in accordance with claim 7 wherein said emitter region and emitter contact forming steps include the steps of:

forming a third layer of polysilicon within said aperture prior to performing said removing step;

doping said third layer; and heating said substrate to diffuse dopant from said third layer into said second device region.

9. A method in accordance with claim 8 and further including the step of forming an extrinsic base region for said bipolar transistor by diffusing dopant from said second layer into said second device region.

10. A method comprising the steps of:

providing a substrate of semiconductor material including at least first and second electrically isolated device regions;

forming a first layer of insulating material over said first device region;

forming a second layer of conductive material generally conformally over said first and second device regions, said second layer spaced from the surface of said first device region by said first layer and said second layer contacting the surface of said second device region;

forming an aperture in said second layer over said second device region;

forming an intrinsic base region in said second device region through said aperture;

removing portions of said second layer over said first and second device regions to leave a base contact on the surface of said second device region and a separate gate contact insulated from the surface of said first device region by said first layer;

said steps of forming said aperture and forming said extrinsic base region being performed before said removing step;

forming a field-effect transistor having a channel region underlying said gate contact in said first device region; and forming a vertical bipolar transistor having a base region contacting said base contact in said second device region.

* * * * *